United States Patent [19]

Baum et al.

[11] Patent Number: 5,916,359
[45] Date of Patent: Jun. 29, 1999

[54] ALKANE AND POLYAMINE SOLVENT COMPOSITIONS FOR LIQUID DELIVERY CHEMICAL VAPOR DEPOSITION

[75] Inventors: Thomas H. Baum, New Fairfield; Gautam Bhandari, Danbury, both of Conn.

[73] Assignee: Advanced Technology Materials, Inc., Danbury, Conn.

[21] Appl. No.: 08/975,372

[22] Filed: Nov. 20, 1997

Related U.S. Application Data

[63] Continuation-in-part of application No. 08/484,654, Jun. 7, 1995, which is a continuation-in-part of application No. 08/414,504, Mar. 31, 1995, Pat. No. 5,820,664.

[51] Int. Cl.⁶ .............................. C09K 3/00; C23C 16/40
[52] U.S. Cl. .............................. 106/287.18; 106/287.17; 106/287.19; 252/182.12; 252/364; 423/DIG. 14; 427/248.1
[58] Field of Search .............................. 252/182.12, 364; 106/1.25, 287.18; 505/447, 512; 423/DIG. 14; 44/432; 585/2, 3; 501/137

[56] References Cited

U.S. PATENT DOCUMENTS

| | | | |
|---|---|---|---|
| 2,839,421 | 6/1958 | Albisetti | 106/287.17 |
| 3,076,834 | 2/1963 | Norton | 556/175 X |
| 3,647,712 | 3/1972 | Lucid | 252/364 |
| 3,653,953 | 4/1972 | Grant, Jr. et al. | 106/1.25 X |
| 4,147,556 | 4/1979 | Donley | 106/287.18 |
| 4,281,037 | 7/1981 | Choung | 427/407.3 |
| 4,401,474 | 8/1983 | Donley | 106/243 |
| 4,510,222 | 4/1985 | Okunaka et al. | 430/5 |
| 4,529,427 | 7/1985 | French | 65/3.12 |
| 4,726,938 | 2/1988 | Rollat et al. | 423/DIG. 14 |
| 4,898,842 | 2/1990 | David | 501/12 X |
| 4,908,065 | 3/1990 | Tanitsu et al. | 106/287.19 X |
| 5,034,372 | 7/1991 | Matsuno et al. | 505/1 |
| 5,110,622 | 5/1992 | Hasegawa et al. | 427/126.1 |
| 5,120,703 | 6/1992 | Snyder et al. | 505/1 |
| 5,122,510 | 6/1992 | Chen et al. | 505/512 X |
| 5,165,960 | 11/1992 | Platts | 427/166 |
| 5,204,314 | 4/1993 | Kirlin et al. | 505/1 |
| 5,225,561 | 7/1993 | Kirlin et al. | 546/256 |
| 5,280,012 | 1/1994 | Kirlin et al. | 505/1 |
| 5,376,409 | 12/1994 | Kaloyeros et al. | 427/248.1 |
| 5,412,129 | 5/1995 | DiCarolis | 556/40 |
| 5,504,195 | 4/1996 | Leedham et al. | 505/512 X |
| 5,518,536 | 5/1996 | Doellein | 106/1.25 |
| 5,696,384 | 12/1997 | Ogi et al. | 252/182.12 |
| 5,820,664 | 10/1998 | Gardiner et al. | 106/287.17 |

FOREIGN PATENT DOCUMENTS

| 530875 | 1/1977 | Russian Federation | 585/3 |
|---|---|---|---|

OTHER PUBLICATIONS

Zhang, J. et al., Single Liquid Source Plasma–Enhanced Metalorganic Chemical Vapor Deposition of High Quality $YBa_2Cu_3O_{7-x}$ Thin Films, Appl. Phys. Lett. 61, 2884–6 (1992).

Van Buskirk, P.C. et al., "MOCVD Growth of $BaTiO_3$ in an 8" Single–Wafer CVD Reactor," Proc. ISAF 92, Eighth Int'l Symp. Appl. Ferroelectrics, Agu. 31–Sep. 2, 1992.

Hiskes, R. et al., "Single Source Metalorgainc Chemical Vapor Deposition of Low Microwave Surface Resistance $YBa_2Cu_3O_7$," Appl. Phys. Lett. 59, 606–7 (1991).

Zhang et al., "Plasma Enhanced Metalorganic Chemical Vapor Deposition of Conductive Oxide Electrodes for Ferroelectric $BaTiO_3$ Capacitors." Mater. Res. Soc. Symp. Proc. vol. 310, pp. 249–254 (1993).

Zhang et al., "Metal Organic Chemical Vapor Deposition of LaSrCoO Electrodes for Ferroelectric Capacitors," 6th ISAF Mtg., Mar., 1994.

Primary Examiner—Richard D. Lovering
Attorney, Agent, or Firm—Steven J. Hultquist; Oliver A.M. Zitzmann

[57] ABSTRACT

A solvent composition useful for liquid delivery chemical vapor deposition of organometallic precursors such as β-diketonate metal precursors. The solvent composition comprises a mixture of solvent species A, B and C in the proportion A:B:C wherein A is from about 3 to about 7 parts by volume, B is from about 2 to about 6 parts by volume, and C is from 0 to about 3 parts by volume, wherein A is a $C_6$–$C_8$ alkane, B is a $C_8$–$C_{12}$ alkane, and C is a glyme-based solvent (glyme, diglyme, tetraglyme, etc.) or a polyamine. The particular solvent composition including octane, decane and polyamine in an approximate 5:4:1 weight ratio is particularly usefully employed in the formation of $SrBi_2Ta_2O_9$ films.

23 Claims, 2 Drawing Sheets

Upstream Pressure at 180 °C for SBT (w/Bi(thd)3) in Octane:Decane:pmdeta (5:4:1)

ALKANE AND POLYAMINE SOLVENT COMPOSITIONS FOR LIQUID DELIVERY CHEMICAL VAPOR DEPOSITION

CROSS-REFERENCE TO RELATED APPLICATIONS

This is a continuation in part of U.S. patent application Ser. No. 08/484,654 filed Jun. 7, 1995, which in turn is a continuation in part of U.S. patent application Ser. No. 08/414,504 filed Mar. 31, 1995 now U.S. Pat. No. 5,820,664. This application is being concurrently filed in the United States Patent and Trademark Office with the following United States patent application: U.S. patent application Ser. No. 08/975,087 in the names of Frank S. Hintermaier, Peter C. Van Buskirk, Jeffrey F. Roeder, Bryan C. Hendrix, Thomas H. Baum, Debra A. Desrochers, Christine Dehm, and Wolfgang Hoenlein for "Low Temperature Chemical Vapor Depostion Process for Forming Bismuth-Containing Ceramic Thin Films Useful in Ferroelectric Memory Devices." This application is also related to U.S. patent application Ser. No. in the names of Thomas H. Baum, Gautam Bhandari and Margaret Chappuis for "Anhydrous Mononuclear Tris(Beta-Diketonate) Bismuth Compositions, and Method of Making the Same," filed Oct. 30, 1997 now U.S. Pat. No. 5,859,274. The disclosures of all of the aforementioned applications are hereby incorporated herein by reference in their entirety.

BACKGROUND OF THE INVENTION

1. Field of the Invention

The present invention relates to a solvent composition useful for liquid delivery chemical vapor deposition of metal organic precursors including metal (β-diketonate) precursors.

2. Description of the Related Art

In the liquid delivery method of carrying out chemical vapor deposition (CVD) processes, a solid precursor is dissolved in an appropriate solvent medium or a liquid-phase precursor is vaporized and the resulting precursor vapor, typically mixed with a carrier gas (such as argon or nitrogen) is transported to the chemical vapor deposition reactor. In the reactor, the precursor vapor stream is contacted with a heated substrate to effect decomposition and deposition of a desired component or components from the vapor phase on the substrate surface.

In such liquid delivery CVD process, a wide variety of solvents have been employed for dissolution or suspension of precursor species, with the liquid solution or suspension being vaporized by various techniques, including flash vaporization on a heated element onto which the liquid containing the precursor is discharged, to volatilize the solvent and precursor species.

In many instances, where a variety of precursors are employed to form a multi-component deposited film in the CVD process, it is desirable to utilize a single solvent medium for the respective precursor species, for ease of operation and simplicity of the process system, thereby avoiding any deleterious solvent-solvent interactions which may occur if different solvent media are utilized for different precursor species. Further, it is desirable that solvent compositions when used for multiple species not interact with the precursor or metal-containing molecules to form unstable chemical solutions, since such instability renders the overall composition unsuitable for liquid delivery.

It therefore is the object of the present invention to provide a novel solvent composition having broad utility for CVD precursors, such as those comprising metal organic compositions with β-diketonate ligands.

Other objects and advantages of the present invention will be more filly apparent from the ensuing disclosure and appended claims.

SUMMARY OF THE INVENTION

The present invention relates to a solvent composition for liquid delivery chemical vapor deposition of metal organic precursors.

The composition of the invention comprises a mixture of solvent species A, B and C in the proportion A:B:C wherein A is from about 3 to about 7 parts by volume, B is from about 2 to about 6 parts by volume, and C is from 0 to about 3 parts by volume, and wherein A is a $C_6$–$C_8$ alkane, B is a $C_8$–$C_{12}$ alkane, and C is a glyme-based solvent (glyme, diglyme, tetraglyme, etc.) or a polyamine.

In a specific and preferred aspect, the solvent composition may comprise octane, decane and a polyamine in approximately 5:4:1 proportion by volume.

Preferred polyamine species useful as component C in the composition of the solvent composition may be any suitable polyamine, as for example N,N,N',N'-tetramethylethylenediamine, N,N,N',N",N"-pentamethyldiethylenetriamine, N,N,N',N",N"',N"'-hexamethyltriethylenetetramine, or other suitable polyamine component.

In another aspect, the present invention relates to a precursor composition for liquid delivery chemical vapor deposition, including at least one metal organic precursor component in a solvent mixture comprising a mixture of solvent species A, B and C in the proportion A:B:C wherein A is from about 3 to about 7 parts by volume, B is from about 2 to about 6 parts by volume, and C is from 0 to about 3 parts by volume, wherein A is a $C_6$–$C_8$ alkane, B is a $C_8$–$C_{12}$ alkane, and C is a glyme-based solvent (glyme, diglyme, tetraglyme, etc.) or a polyamine.

The metal organic precursor in such composition may for example comprise one or more metal β-diketonate(s) and/or adduct(s) thereof.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
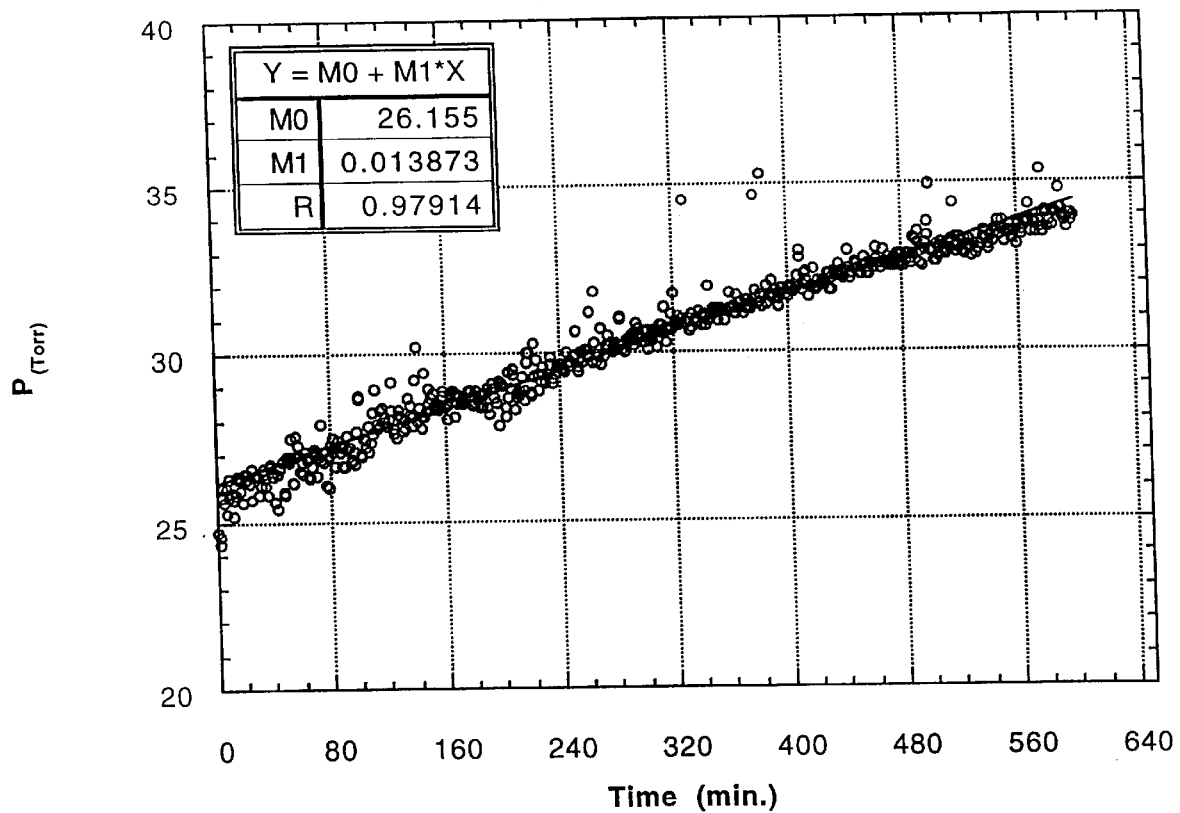
FIG. 1 is a plot of upstream pressure, in torr, as a function of time, in minutes, for a liquid delivery chemical vapor deposition system employed for vaporization of the precursor solution at 180° C. and deposition of strontium bismuth tantalate, utilizing β-diketonate precursors for strontium, bismuth and tantalum, in a 8:2:1 solvent composition of tetrahydrofuran:isopropanol:polyamine.

The present invention is based on the discovery of solvent compositions which are advantageously used for liquid delivery chemical vapor deposition of metal organic precursors such as metal β-diketonate precursors, e.g., of Group II metals. Such solvent compositions have been found highly advantageous in carrying out deposition of metals from such β-diketonate precursors, including β-diketonate-based complexes of metals such as strontium, bismuth, tantalum, and the like.

The composition of the invention comprises a mixture of solvent species A, B and C in the proportion A:B:C wherein A is from about 3 to about 7 parts by volume of the solution (A+B+C), B is from about 2 to about 6 parts by volume of the solution, and C is from 0 to about 3 parts by volume of the solution, and wherein A is a $C_6$–$C_8$ alkane, B is a $C_8$–$C_{12}$ alkane, and C is a glyme-based solvent (glyme, diglyme, tetraglyme, etc.) or a polyamine. A highly preferred composition according to the present invention includes octane as solvent species A and decane as solvent species B, with C being either polyamine or tetraglyme, in a 5:4:1 ratio of the respective solvent species A, B and C.

In a particularly preferred aspect of the invention, a 5:4:1 solvent composition of octane:decane:polyamine is utilized as a solvent species for each of the strontium, bismuth and tantalum β-diketonate precursors for liquid delivery chemical vapor deposition of $SrBi_2Ta_2O_9$.

The solvent compositions of the invention permit low pressure volatilization of the β-diketonate precursors, and afford good transport and minimal residue in the vaporization and chemical vapor deposition process.

When C in the A:B:C solvent composition is a polyamine, the polyamine component of the solvent composition may be any suitable polyamine. Examples include N,N,N',N'-tetramethylethylenediamine, N,N,N',N",N"-pentamethyldiethylenetriamine, N,N,N',N",N'",N'"-hexamethyltriethylenetetramine, etc.

The metal β-diketonate precursors with which the solvent composition of the invention may be employed include β-diketonate compositions whose metal constituent may be any suitable metal, as for example strontium, bismuth, tantalum, niobium, lead, calcium, barium, iron, aluminum, scandium, yttrium, titanium, tungsten, molybdenum and lanthanide metals such as Ce, La, Pr, Ho, Eu, Yb, etc. The β-diketonate ligand may be any suitable species, as for example a β-diketonate ligand selected from the group consisting of:

2,2,6,6-tetramethyl-3,5-heptanedionato;
1,1,1-trifluoro-2,4-pentanedionato;
1,1,1,5,5,5-hexafluoro-2,4-pentanedionato;
6,6,7,7,8,8,8-heptafluoro-2,2-dimethyl-3,5-octanedionato;
2,2,7-trimethyl-3,5-octanedionato;
1,1,1,5,5,6,6,7,7,7-decafluoro-2,4-heptanedionato; and
1,1,1-trifluoro-6-methyl-2,4-heptanedionato.

The solvent composition of the present invention has particular utility for the deposition of bismuth-containing thin films, using bismuth precursors such as anhydrous mononuclear tris(2,2,6,6-tetramethyl-3,5-heptanedionato) bismuth and polyamine adducted $Sr(thd)_2$. Such metal β-diketonate compounds may be readily employed in the solvent compositions of the invention to prepare superior bismuth-containing thin films, such as $SrBi_2Ta_2O_9$.

Features and advantages of the present invention are more fully shown with respect to the following non-limiting example, wherein all parts and percentages are by weight, unless otherwise expressly stated.

EXAMPLE

A solution containing 7 atomic percent $Sr(thd)_2$ (pentamethyldiethylenetriamine), 55 atomic percent Bi(thd)$_3$ and 38 atomic percent Ta(OiPr)$_4$(thd), wherein thd=2,2,6,6-tetramethyl-3,5-heptanedionato, in a solvent mixture of 5:4:1 octane:decane:pentamethyldiethylenetriamine is metered to the liquid delivery chemical vapor deposition system where the precursor solution is flash vaporized at 190° C. and then carried to the CVD chamber in 400 sccm argon. The precursor vapor is mixed with 1100 sccm oxygen and then additional 100 sccm argon for a combined for a 7:3 oxygen:argon ratio, and is passed through a showerhead disperser to the chemical vapor deposition chamber which is maintained at 1 torr. Decomposition occurs on a substrate heated to a surface temperature of 385° C. The substrate is a 0.5 micron linewith $SiO_2$(TEOS) structure covered with platinum. The SBT film produced on the substrate is highly conformal (≧90%), exhibiting a minimum SBT sidewall thickness which is greater than 90% of the top maximum thickness, consistent with the device requirements for microelectronic fabrication. The low temperature and amorphous character of the deposition contribute to the conformal coating of the deposited film. Under these conditions, the composition varies less than 0.5% relative (which is within the precision of the x-ray fluorescence method employed).

FIG. 1 is a plot of upstream pressure, in torr, as a function of time, in minutes, for a liquid delivery chemical vapor deposition system employed for deposition of strontium bismuth tantalate, with vaporization of the precursor solution at 180° C., and utilizing β-diketonate precursors for strontium, bismuth and tantalum, in a 8:2:1 solvent composition of tetrahydrofuran:isopropanol:polyamine. Such solvent composition is typical of the solvent compositions heretofore used in the art for precursors such as metal beta-diketonates and adducts thereof.

Figure 2:
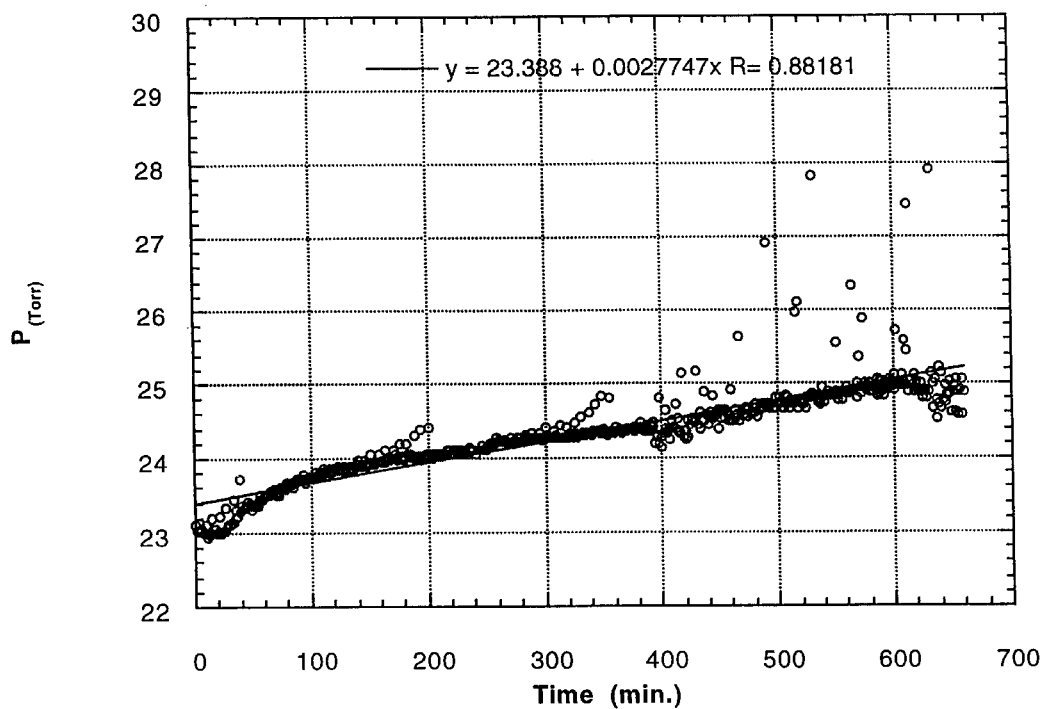
FIG. 2 is a plot of upstream pressure, in torr, as a function of time, in minutes, for a liquid delivery chemical vapor deposition system employed for deposition of strontium bismuth tantalate following precursor solution vaporization at 180° C., utilizing β-diketonate precursors for strontium, bismuth and tantalum, in a solvent composition according to the invention comprising 5:4:1 octane:decane:polyamine.

FIG. 2 shows upstream pressure in a liquid delivery system employed for vaporization of metal organic precursors in a solvent composition of the present invention, 5:4:1 octane:decane:pentamethyldiethylenetramine. The precursor components of such precursor solution are $Sr(thd)_2$ (pentamethyldiethylenetriamine), Bi(thd)$_3$ and Ta(OiPr)$_4$(thd) where thd=2,2,6,6-tetramethyl-3,5-heptanedionato, wherein the bismuth reagent is of anhydrous mononuclear form. The plot of FIG. 2 shows the upstream pressure in torr as a function of time in minutes for vaporization of the precursor solution at 180° C. As shown, the upstream pressure is highly uniform over the time frame of the process, indicating good vaporization and transport properties of the precursors in such solvent mixture with concomitant low levels of residue (significant levels of residue being indicative of clogging which significantly increases upstream pressure).

The steep increase in pressure shown in the curve for FIG. 1 is indicative of decomposition of the precursor resulting in clogging of the liquid delivery system. As a consequence of such clogging, the liquid delivery system fails to deliver the precursor in the desired amount and at the desired rate to the downstream chemical vapor deposition chamber, and thereby lowers the overall process efficiency.

The plots of FIGS. 1 and 2 therefore show the superior solvent efficacy of the solvent composition of the present invention.

While the invention has been illustratively described with respect to particular feature aspects and embodiments herein, it will be appreciated that the utility invention is not thus limited, and other variations, modifications and embodiments will readily suggest themselves to those skilled in the art. Accordingly, the invention is to be broadly construed, consistent with the claims hereafter set forth.

What is claimed is:

1. A solvent composition for liquid delivery chemical vapor deposition of metal organic precursors, comprising a mixture of solvent species A, B and C in the proportion A:B:C wherein A is from about 3 to about 7 parts by volume, B is from about 2 to about 6 parts by volume, and C is present up to about 3 parts by volume, wherein said parts by volume are based on the total volume of the mixture, and wherein A is a $C_6$–$C_8$ alkane, B is a $C_8$–$C_{12}$ alkane, A and B are different from one another, and C is selected from the group consisting of glyme-based solvents and polyamines.

2. A composition according to claim 1, wherein said solvent species C is a glyme-based solvent selected from the group consisting of glyme, diglyme, and tetraglyme.

3. A composition according to claim 1, wherein said solvent species C is a polyamine selected from the group consisting of N,N,N',N'-tetramethylethylenediamine, N,N,N',N",N"-pentamethyldiethylenetriamine, and N,N,N',N",N"',N"'-hexamethyltriethylenetetramine.

4. A composition according to claim 1, wherein A:B:C are in approximately 5:4:1 proportion by volume.

5. A composition according to claim 1, wherein the solvent species C comprises N,N,N',N",N"-pentamethyldiethylenetriamine.

6. A composition according to claim 1, wherein the solvent species C comprises N,N,N',N",N"',N"'-hexamethyltriethylenetetramine.

7. A composition according to claim 1, wherein the solvent species C comprises N,N,N',N'-tetramethylethylenediamine.

8. A solvent composition, comprising octane, decane and a polyamine in the proportion octane:decane:polyamine wherein octane is from about 3 to about 7 parts by volume, decane is from about 2 to about 6 parts by volume, and polyamine is present up to about 3 parts by volume, and wherein said parts by volume are based on the total volume of the solvent composition.

9. An alkane/polyamine solvent composition for liquid delivery chemical vapor deposition of metal organic precursors, said composition comprising octane, decane and a polyamine in an approximate respective volume ratio of 5:4:1.

10. A precursor composition for liquid delivery chemical vapor deposition, comprising a metal organic precursor in a solvent composition comprising a mixture of solvent species A, B and C in the proportion A:B:C wherein A is from about 3 to about 7 parts by volume, B is from about 2 to about 6 parts by volume, and C is present up to about 3 parts by volume, wherein said parts by volume are based on the total volume of the mixture, and wherein A is a $C_6$–$C_8$ alkane, B is a $C_8$–$C_{12}$ alkane, A and B are different from one another, and C is selected from the group consisting of glyme-based solvents and polyamines.

11. A precursor composition according to claim 10, wherein said solvent species C is a glyme-based solvent selected from the group consisting of glyme, diglyme, and tetraglyme.

12. A precursor composition according to claim 10, wherein said solvent species C is a polyamine selected from the group consisting of N,N,N',N'-tetramethylethylenediamine, N,N,N',N",N"-pentamethyldiethylenetriamine, and N,N,N',N",N"',N"'-hexamethyltriethylenetetramine.

13. A precursor composition according to claim 10, wherein A:B:C are in approximately 5:4:1 proportion by volume.

14. A precursor composition according to claim 10, wherein the solvent species C comprises N,N,N',N",N"-pentamethyldiethylenetriamine.

15. A precursor composition according to claim 10, wherein the solvent species C comprises N,N,N',N",N"',N"'-hexamethyltriethylenetetramine.

16. A composition according to claim 10, wherein the solvent species C comprises N,N,N',N'-tetramethylethylenediamine.

17. A precursor composition according to claim 10, wherein said metal organic precursor comprises a metal β-diketonate precursor.

18. A precursor composition according to claim 10, wherein said metal organic precursor includes a Group II metal.

19. A precursor composition according to claim 10, wherein said metal organic precursor includes a metal selected from the group consisting of Bi, Ca, Sr, Ba, Pb, Na, Fe, Al, Sc, Y, Ti, Nb, Ta, W, Mo and metals of the lanthanide series.

20. A precursor composition according to claim 10, wherein said metal organic precursor comprises β-diketonate complexes of strontium, bismuth and tantalum.

21. A precursor composition according to claim 10, wherein said metal organic precursor comprises $Sr(thd)_2$ (pentamethyldiethylenetriamine), $Bi(thd)_3$ and $Ta(OiPr)_4$(thd) where thd=2,2,6,6-tetramethyl-3,5-heptanedionato.

22. A composition according to claim 10, wherein said metal organic precursor comprises a β-diketonato metal complex wherein the β-diketonato ligand is selected from the group consisting of:

2,2,6,6-tetramethyl-3,5-heptanedionato;

1,1,1-trifluoro-2,4-pentanedionato;

1,1,1,5,5,5-hexafluoro-2,4-pentanedionato;

6,6,7,7,8,8,8-heptafluoro-2,2-dimethyl-3,5-octanedionato;

2,2,7-trimethyl-3,5-octanedionato;

1,1,1,5,5,6,6,7,7,7-decafluoro-2,4-heptanedionato; and 1,1,1-trifluoro-6-methyl-2,4-heptanedionato.

23. A precursor composition, comprising a solvent mixture of octane, decane and a polyamine in the proportion octane:decane:polyamine wherein octane is from about 3 to about 7 parts by volume, decane is from about 2 to about 6 parts by volume, and polyamine is present up to about 3 parts by volume, and wherein said parts by volume are based on the total volume of the solvent mixture.

* * * * *

UNITED STATES PATENT AND TRADEMARK OFFICE
CERTIFICATE OF CORRECTION

PATENT NO.    : 5,916,359
DATED         : June 29, 1999
INVENTOR(S)   : Baum et al.

It is certified that error appears in the above-identified patent and that said Letters Patent is hereby corrected as shown below:

<u>Title page,</u>
Item [56], References Cited, under OTHER PUBLICATONS, "metalorgainc" should be -- metalorganic --

Signed and Sealed this

Thirtieth Day of July, 2002

Attest:

Attesting Officer

JAMES E. ROGAN
Director of the United States Patent and Trademark Office